(12) United States Patent
Wong et al.

(10) Patent No.: US 7,821,343 B1
(45) Date of Patent: Oct. 26, 2010

(54) TRANSMITTER WITH MULTIPLE PHASE LOCKED LOOPS

(75) Inventors: Wilson Wong, San Francisco, CA (US); Sergey Shumarayev, Los Altos Hills, CA (US); Allen Chan, San Jose, CA (US); Weiqi Ding, Fremont, CA (US)

(73) Assignee: Altera Corporation, San Jose, CA (US)

( * ) Notice: Subject to any disclaimer, the term of this patent is extended or adjusted under 35 U.S.C. 154(b) by 112 days.

(21) Appl. No.: 12/229,813

(22) Filed: Aug. 27, 2008

(51) Int. Cl.
*H03L 7/00* (2006.01)
(52) U.S. Cl. .............................. 331/2; 331/49; 331/16; 327/147; 327/156
(58) Field of Classification Search .................... 331/2, 331/49, 57, 167, 117 R, 16; 327/147, 156
See application file for complete search history.

(56) References Cited

U.S. PATENT DOCUMENTS

| | | | |
|---|---|---|---|
| 7,449,961 B2 * | 11/2008 | Sai et al. ........................ | 331/2 |
| 7,539,278 B2 * | 5/2009 | Shumarayev et al. ....... | 375/376 |
| 7,589,597 B2 * | 9/2009 | Chang et al. .................. | 331/37 |
| 7,602,253 B2 * | 10/2009 | Kim et al. ...................... | 331/2 |
| 7,602,254 B2 * | 10/2009 | Sandner et al. ................ | 331/2 |

* cited by examiner

*Primary Examiner*—Joseph Chang
(74) *Attorney, Agent, or Firm*—Mauriel Kapouytian & Treffert LLP; Ararat Kapouytian

(57) ABSTRACT

A transmitter that includes a first phase locked loop (PLL) and a second PLL coupled to the first PLL is described. In one implementation, the first PLL is an inductance-capacitance (LC) type PLL and the second PLL is a ring type PLL. Also, in one embodiment, the transmitter further includes a PLL selection multiplexer coupled to the first and second PLLs, where the PLL selection multiplexer receives an output of the first PLL and an output of the second PLL and outputs either the output of the first PLL or the output of the second PLL. In one implementation, a control signal for controlling selection by the PLL selection multiplexer is programmable at runtime. In one implementation, the transmitter of the present invention further includes a clock generation block coupled to the PLL selection multiplexer, a serializer block coupled to the clock generation block and a transmit driver block coupled to the serializer block. In one embodiment, the transmit driver block includes only one post-tap pre-driver and only one main-tap pre-driver. The transmitter of the present invention is capable of operating in a wide range mode or a low jitter mode by selecting the appropriate PLL. In wide range mode, a wider frequency range is desirable. On the other hand, in low jitter mode, a low jitter is desirable.

21 Claims, 4 Drawing Sheets

TRANSMITTER WITH MULTIPLE PHASE LOCKED LOOPS

BACKGROUND

The present invention relates to transmitters.

A transmitter generally includes a phase locked loop (PLL) which generates a clock signal. The clock signal or a divided version thereof (in terms of frequency) is locked with a reference clock signal. The frequency range covered by a PLL, among other things, depends on the voltage controlled oscillator (VCO) and the divide factor of the PLL.

One type of VCO used in PLLs is the ring type VCO. A PLL using a ring type VCO is herein referred to as a ring type PLL. The ring type PLL is capable of generating clock signals covering a relatively wide range of frequencies. As a result, such PLLs are sometimes referred to as wide range PLLs. A ring type PLL has the advantage of covering a wide range of frequencies. However, the ring type PLL suffers from relatively high jitter. The jitter worsens with higher clock frequencies. In some cases, the jitter of a clock signal surpasses a tolerance limit for jitter, which makes the clock signal unacceptable.

Another type of VCO is the inductance-capacitance (LC) type VCO. A PLL using an LC type VCO is herein referred to as an LC type PLL. Unlike the ring type PLL, the LC type PLL has relatively low jitter. As a result, such PLLs are sometimes referred to as low jitter PLLs. One disadvantage of an LC type PLL is that it has a relatively narrow frequency range.

It is desirable to have a transmitter that overcomes the above disadvantages.

SUMMARY

In one aspect, an embodiment of the present invention provides a transmitter that includes a first PLL and a second PLL coupled to the first PLL. In one embodiment, the first PLL is an LC type PLL and the second PLL is a ring type PLL. Also, in one embodiment, the transmitter further includes a PLL selection multiplexer coupled to the first and second PLLs, where the PLL selection multiplexer receives an output of the first PLL and an output of the second PLL and outputs either the output of the first PLL or the output of the second PLL. In one implementation, a control signal for controlling selection by the PLL selection multiplexer is programmable at runtime.

In one embodiment, the transmitter further includes a reference clock signal selection circuit. In one embodiment, control signals for controlling selection of the reference clock signal are programmable at runtime.

In one embodiment, the transmitter further includes a clock generation block coupled to the PLL selection multiplexer, a serializer block coupled to the clock generation block and a transmit driver block coupled to the serializer block. In one embodiment, the transmit driver block includes only one post-tap pre-driver and only one main-tap pre-driver.

The transmitter of the present invention is capable of operating in a wide range mode or a low jitter mode by selecting the appropriate PLL. In wide range mode a wider frequency range is desirable. On the other hand, in low jitter mode, a low jitter is desirable. The ability to select the performance profile of the device transmitter is a generally useful feature. It is particularly useful in situations where standards are evolving. For example, 10 gigabits per second (Gbps) standards are still being defined and are subject to change. In such a case, the transmitter of the present invention, with its above-mentioned flexibility, is better suited to meet these evolving standards.

BRIEF DESCRIPTION OF THE DRAWINGS

The novel features of the invention are set forth in the appended claims. However, for purpose of explanation, several aspects of particular embodiments of the invention are described by reference to the following figures.

DETAILED DESCRIPTION

The following description is presented to enable any person skilled in the art to make and use the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
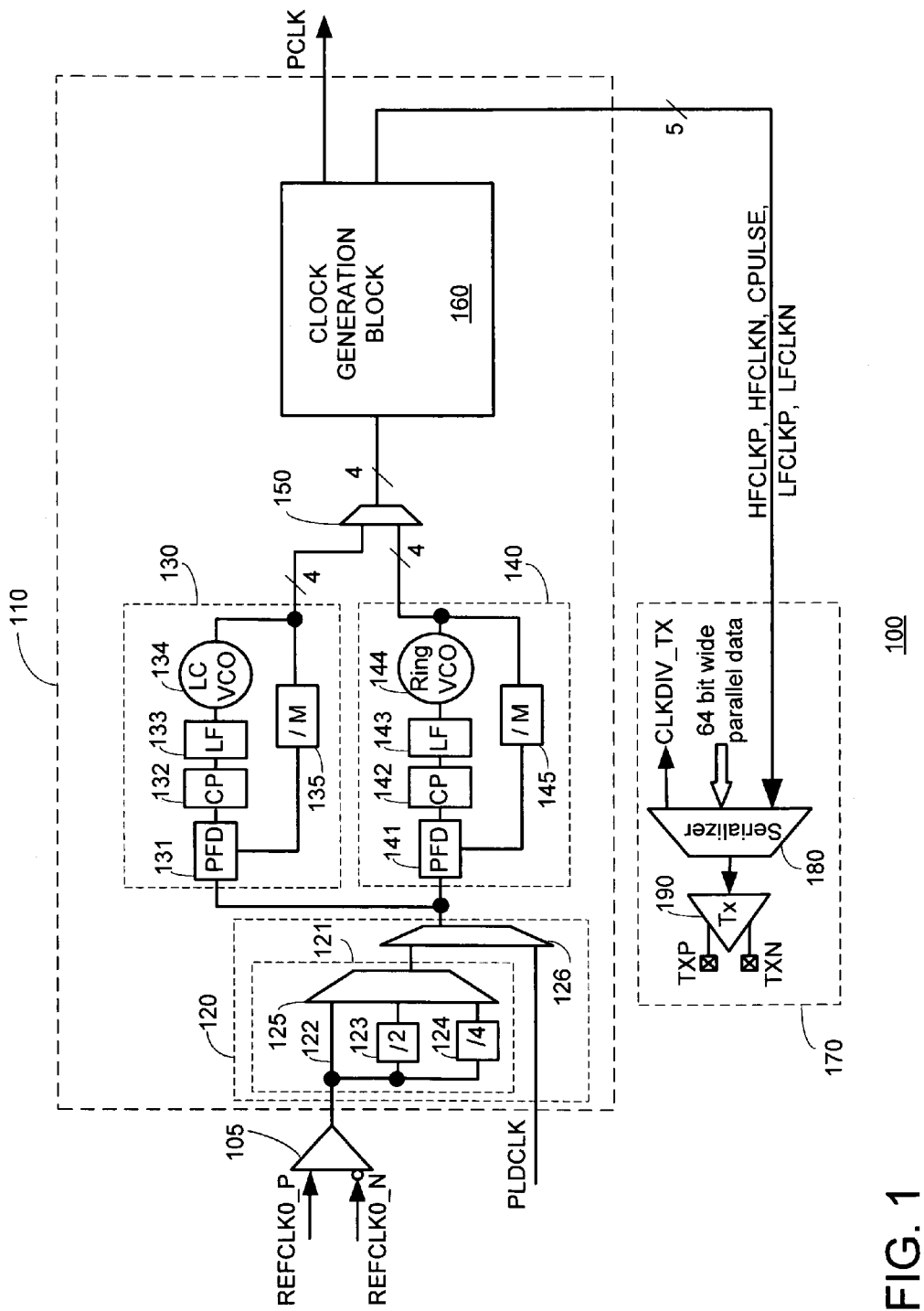
FIG. 1 is a block diagram of one embodiment of the transmitter of the present invention.

FIG. 1 is a block diagram of one embodiment of the transmitter of the present invention. In FIG. 1, transmitter 100 includes clock input buffer 105, clock management unit (CMU) 110 coupled to clock input buffer 105, and transmit path 170 connected to CMU 110. In FIG. 1, CMU 110 is shown as being coupled to one transmit path, transmit path 170. It is to be noted, however, that CMU 110 may be coupled to multiple transmit paths.

Clock input buffer 105 receives reference clock signals REFCLK0_P and REFCLK0_N. REFCLK0_P is a positive polarity reference clock signal. In other words, it is a reference clock signal that has a positive polarity with respect to a reference level. REFCLK0_N is a negative polarity reference clock signal. In other words, it is a reference signal that has a negative polarity with respect to the reference level. In one embodiment, REFCLK0_P and REFCLK0_N are low voltage positive-referenced emitter coupled logic (LVPECL) clock signals generated by an external clock generator. Clock input buffer 105 receives REFCLK0_P and REFCLK0_N and outputs a single ended reference clock signal.

Figure 4:
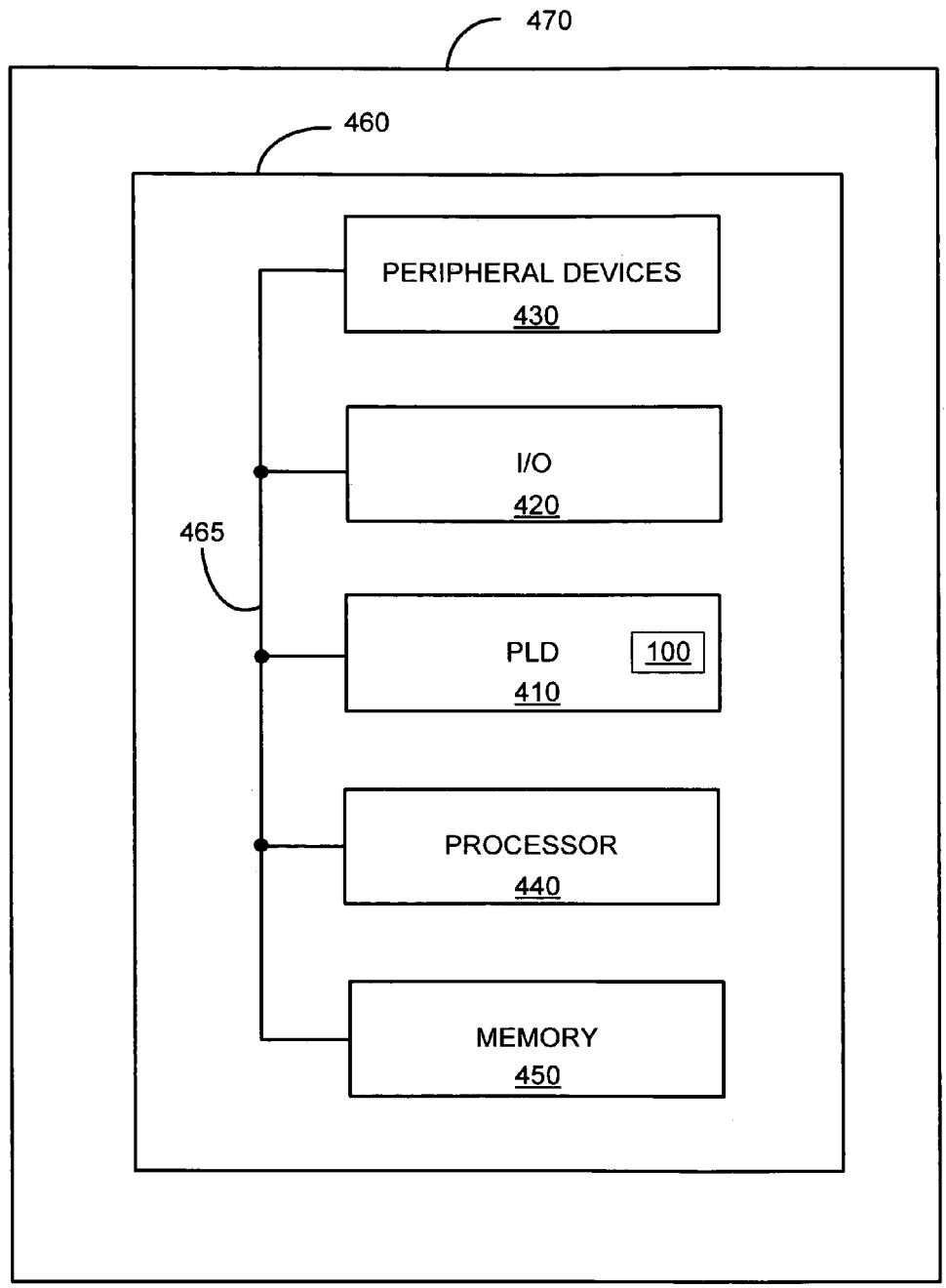
FIG. 4 illustrates an exemplary data processing system including an exemplary programmable logic device in which transmitters in accordance with the present invention might be implemented.

CMU 110 receives the output of clock input buffer 105. CMU 110 also receives a reference clock signal PLDCLK. In one embodiment, PLDCLK is a reference clock signal from the core of a device, e.g., a programmable logic device (PLD) (an example of which is shown in FIG. 4). CMU 110 includes selection circuit 120, LC type PLL 130, ring type PLL 140, PLL selection multiplexer 150, and clock generation block 160, which are connected as shown in FIG. 1.

Selection circuit 120 is connected to clock input buffer 105 and the input terminal providing PLDCLK. Selection circuit 120 includes first selection circuit 121 and multiplexer 126, which are connected as shown. First selection circuit 121 is connected to clock input buffer 105 from which it receives a reference clock signal. In first selection circuit 121, the reference clock signal received from clock input buffer 105 is diverted into three different paths. In first path 122, the frequency of the reference clock signal is unchanged. Alternatively, first path 122 may include a divide by 1 divider, which would not change the frequency of the reference clock signal. The second path includes divider 123, a divide-by-two divider, which divides the frequency of the reference clock signal by two and provides a reference clock signal that has half the frequency of the original reference clock signal. The third path includes divider 124, a divide-by-four divider, which divides the frequency of the reference clock signal by four and provides a reference clock signal that has quarter the frequency of the original reference clock signal. The first, second, and third paths are respectively connected to the first, second, and third input terminals of multiplexer 125.

In FIG. 1, multiplexer 125 is a 3 to 1 multiplexer. Multiplexer 125 selects one of its inputs and provides the selected input to multiplexer 126. In FIG. 1, multiplexer 126 is a 2 to 1 multiplexer. Multiplexer 126 also receives the reference clock signal PLDCLK and selects between PLDCLK and the reference clock signal it receives from multiplexer 125. Multiplexer 126 provides its selected reference clock signal to LC type PLL 130 and ring type PLL 140. Thus, transmitter 100 provides the option of using different reference clock signals.

In one embodiment, the divide factors of the first, second, and third paths are programmable at runtime. Similarly, in one embodiment, the control signals for multiplexers 125 and 126 are programmable at runtime.

LC type PLL 130 includes phase frequency detector (PFD) 131, charge pump (CP) 132, loop filter (LF) 133, LC type VCO 134, and divider 135, which are connected as shown in FIG. 1. LC type VCO 134 is optimized to give low jitter performance. As a result, LC type PLL 130 is a low jitter PLL. In one embodiment, the tuning range of LC type PLL 130 is narrower and is targeted towards the most popular 10 Gbps standards. In one embodiment, when selecting clock signals produced by LC type PLL 130, transmitter 100 supports serial data rates of approximately 9.95 Gbps to 11.3 Gbps. In one embodiment, LC type PLL 130 generates four phases of a clock signal. In other words, it generates four clock signals that are respectively 0, 90, 180 and 270 degrees out of phase with respect to a clock signal. The four phases of the clock signal are provided to multiplexer 150 and may be used by clock generation block 160. As indicated in FIG. 1, the path connecting LC type PLL 130 to multiplexer 150 includes 4 lines.

It is to be noted that, in one embodiment, the output of LC type PLL 130 is half rate. In other words, the frequency of the clock signal is half that of the corresponding data rate since data is sampled at twice the rate of the clock signal. In one embodiment, this is accomplished by sampling data on the positive edges of both the 0 and 180 phases of the clock signal, which may respectively sample even and odd bits of data. In another embodiment, it is accomplished by sampling data on both the positive and negative edges of the 0 phase clock signal.

In one embodiment, PFD 131 is a linear phase detector. PFD 131 receives a reference signal from multiplexer 126 and a feedback signal from divider 135. PFD 131 provides the phase and frequency error/mismatch signals between the reference signal and the feedback signal. As noted above, in one embodiment, the clock source for PFD 131 is programmable at runtime and can come either from the dedicated reference clock (which sends the reference clock signals REFCLK0_P and REFCLK0_N) or from the device core (which sends the clock signal PLDCLK). Depending on the mismatch between the reference and feedback signals, PFD 131 provides up or down signals to CP 132.

CP 132 receives the up or down signals from PFD 131 and charges or discharges LF 133. Different current settings, together with settings in LF 133 and LC type VCO 134, determine the bandwidth of the LC type PLL 130. In one embodiment, the settings are programmable at runtime.

In one embodiment, LF 133 is a second-order passive resistance-capacitance (RC) filter. In one embodiment, bandwidth settings of LF 133 are programmable at runtime.

LC type VCO 134 generates the required quadrature clock signals (i.e., 0, 90, 180 and 270 degrees out of phase clock signals) for both clock and data recovery. The quadrature clock signals are used to generate the clock signals required for serialization of parallel data and transmission of serial data via transmitter 100. As noted above, LC type VCO 134 achieves low jitter. As also noted above, in one embodiment, LC type VCO 134 has a relatively narrow tuning range. The frequency of operation of LC type VCO 134 is determined by the "L" (inductance value) and "C" (capacitance value) of LC type VCO 134. In one embodiment, the capacitance value is tuned to change the frequency.

Divider 135 receives an output signal form LC type VCO 134. Divider 135 divides the signal it receives by a factor M and provides its output to PFD 131. In one embodiment, M may be 8, 16, or 32. It is to be noted that M is not limited to these factors, but may take on other values. In one embodiment, the value of M is programmable at runtime. In one embodiment, the value of M is programmed to provide the divide factor necessary for LC type PLL 130 to output clock signals of the desired frequency.

Ring type PLL 140 includes PFD 141, CP 142, LF 143, ring type VCO 144, and divider 145, which are connected as shown in FIG. 1. In one embodiment, ring type VCO 144 has a wider tuning range than LC type VCO 134. As a result, ring type PLL 140 supports a wider tuning range than LC type PLL 130. This allows targeting a wider range of data rates. Some of these data rates may be developing standards that could become popular in the future. In one embodiment, the jitter performance of ring type PLL 140 is not as good as that of LC type PLL 130. In one embodiment, when selecting clock signals produced by ring type PLL 140, transmitter 100 supports serial data rates of approximately 8 Gbps to 11.3 Gbps. In another embodiment, when selecting clock signals produced by ring type PLL 140, transmitter 100 supports serial date rates of approximately 3.125 Gbps to 11.3 Gbps.

In one embodiment, ring type VCO 144 generates the required quadrature clock signals for both clock and data recovery. In other words, ring type PLL 140 generates four phases of a clock signal for both clock and data recovery. The quadrature clock clocks are used to generate the clock signals required for serialization of parallel data and transmission of serial data via transmitter 100. More specifically, ring type PLL 140 generates clock signals that are 0, 90, 180 and 270 degrees out of phase with respect to a clock signal. As indicated in FIG. 1, the path connecting ring type PLL 140 to multiplexer 150 includes 4 lines. In one embodiment, the outputs of ring type PLL 140 are half rate.

It is to be noted that PFD 141, CP 142, LF 143 and divider 145 in ring type PLL 140 are respectively similar to PFD 131, CP 132, LF 133, and divider 135 in LC type PLL 130. As those components of LC type 130 have been described above, their corresponding components in ring type 140 will not be described in detail herein.

LC type PLL 130 and ring type PLL 140 provide their outputs to multiplexer 150. Multiplexer 150 is a 2 to 1 multiplexer and selects the inputs from either LC type PLL 130 or ring type PLL 140 for outputting. It is to be noted that since multiplexer 150 receives four signals from each of the PLLs and outputs four signals, it is in fact, an 8 to 4 multiplexer. As indicated in FIG. 1, the path connecting multiplexer 150 to clock generation block 160 includes 4 lines. Multiplexer 150 provides its output to clock generation block 160. Multiplexer 150 in effect chooses which PLL of the two PLLs would provide clock signals to be used in clock generation block 160. In one embodiment, the select signal for multiplexer 150 is programmable at runtime. If a low jitter clock signal is desired, then multiplexer 150 would select the clock signals received from LC type PLL 130. On the other hand, when a wider tuning range is desired, then multiplexer 150 would select the clock signals received from ring type PLL 140.

Having two different VCOs helps transmitter 100 support a wider range of customer data rates. This is particularly useful as standards (or protocols) are being finalized and new ones are created. The low jitter VCO allows the highest performance for the popular existing 10 Gbps standards.

In one embodiment, an external cleanup circuitry, e.g., a retimer, can be used if the wide range PLL 140 is chosen. The retimer would "clean up" (e.g., reduce the jitter of) the serial data stream output by transmitter 100. In one embodiment, a retimer may be used on the serial data stream output by transmitter 100 even when the clock signals output by LC type PLL 130 are selected.

Clock generation block 160 receives clock signals from multiplexer 150 and generates clock signal PCLK (the parallel clock for core logic) and clock signals HFCLKP, HFCLKN, LFCLKP, LFCLKN, and CPULSE. Clock signal PCLK is a parallel clock signal provided to the core logic (not shown). Clock signals HFCLKP, HFCLKN, LFCLKP, LFCLKN, and CPULSE are provided to transmit path 170.

Figure 2:
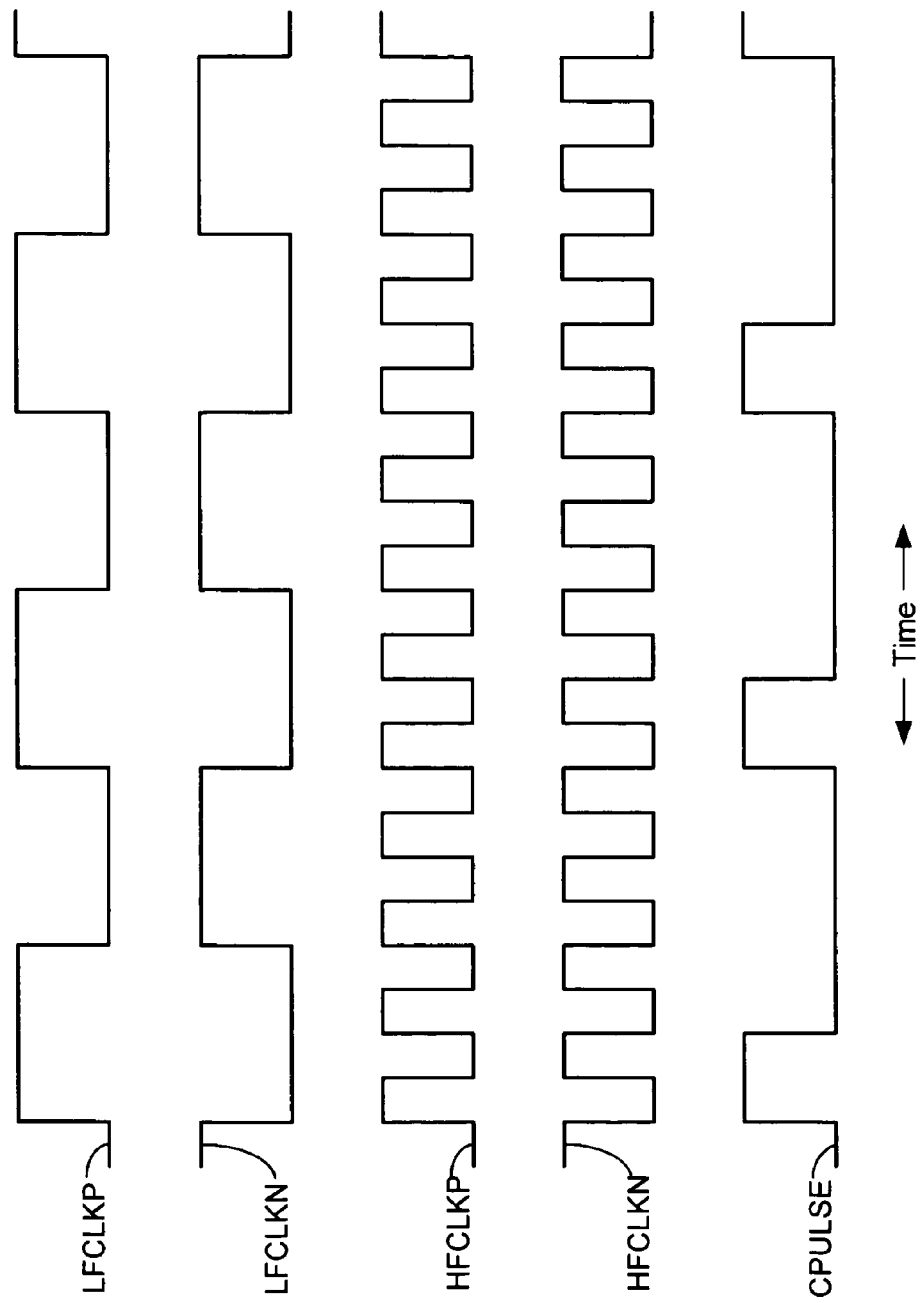
FIG. 2 is an exemplary timing diagram illustrating the relationship between some clock signals in the transmitter of FIG. 1.

FIG. 2 is an exemplary timing diagram illustrating the relationship between some clock signals in the transmitter of FIG. 1. More specifically, FIG. 2 show the relationship between clock signals HFCLKP, HFCLKN, LFCLKP, LFCLKN, and CPULSE. HFCLKP and HFCLKN are both high frequency clock signals with a 50% duty cycle. HFCLKP and HFCLKN have the same frequency and HFCLKN is 180 degrees out of phase with respect to HFCLKP. LFCLKP and LFCLKN are both low frequency clock signals with a duty cycle of 50%. LFCLKP and LFCLKN have the same frequency and LFCLKN is 180 degrees out of phase with respect to LFCLKP. In one embodiment, the frequency of each of LFCLKP and LFCLKN is one fourth the frequency of each of HFCLKP and HFCLKN. CPULSE is a pulse signal with a duty cycle of 25%. In other words, CPULSE is a rectangular wave whose high binary value period is one third its low binary value period. The frequency of CPULSE is equal to that of LFCLKP or LFCLKN. In one embodiment, HFCLKP has the same frequency and phase as the 0 phase clock signal provided by multiplexer 150 and received by clock generation block 160. In one embodiment, the frequency of HFCLKP is 64 times that of PCLK.

Referring back to FIG. 1, transmit path 170 receives signals HFCLKP, HFCLKN, LFCLKP, LFCLKN, and CPULSE from clock generation block 160. Transmit path 170 includes serializer block 180 and transmit driver block 190 connected to serializer block 180. In addition to the above signals from clock generation block 160, serializer block 180 also receives a 64 bit wide parallel data stream from the device core. Serializer block 180 takes clock signals (e.g., HFCLKP and LFCLKP) generated by clock generation block 160, the parallel data, along with the parallel clock signal (associated with the parallel data) it derives from the clock signals (e.g., LFCLKP) it receives, to create a serial data stream (i.e., a 1-bit wide data stream). In one embodiment, the serial data stream has a data rate of approximately 10 Gbps. Serializer block 180 outputs CLKDIV_TX a parallel clock that has the same frequency as PCLK. Additionally, serializer block 180 provides the serial data stream to transmit driver block 190. Transmit driver block 190 outputs differential signals on output terminals TXP and TXN.

Given its flexibility, in terms of PLL selection, reference frequency selection, and programmability of various settings (both at runtime and configuration mode), transmitter 100 may be used in compliance with a wide range of transmission standards. Table 1 below lists a sampling of standards that may be targeted by transmitter 100 and the data rates in Gbps associated with those standards.

TABLE 1

| Standard | Rate (Gbps) |
| --- | --- |
| OC-192, 10GbE WAN | 9.95328 |
| OTU2 | 10.70923 |
| 10 GbE LAN | 10.3125 |
| 10 GbE LAN + FEC | 11.0491 |
| 10 GFC | 10.51875 |
| 10 GFC + FEC | 11.27008 |
| IEEE 802.3ap KR | 10.3125 |
| OIF/CEI 10G-SR/LR | 9.95-11.1 |
| OIF SFI-5.2 | 9.95-11.1 |
| OIF/CEI 10G | 3.125-11.1 |
| OIF SPI-S | 3.125-11.1 |
| XFI (XFP), SFP+ | 9.95-11.27 |

Table 2 below lists some transmission standards, their data rates, and some transmitter settings associated with those rates.

TABLE 2

| Application | Ref Clock Freq (MHz) | Ref Div | M | VCO Freq (MHz) | PLL Freq (MHz) | Data Rate (Gbps) |
| --- | --- | --- | --- | --- | --- | --- |
| 802.3ae | 161.13 | 1 | 32 | 5156.16 | 5156.16 | 10.312 |
| | 644.53 | 2 | 16 | 5156.24 | 5156.24 | 10.312 |
| 10G FC | 164.35 | 1 | 32 | 5259.2 | 5259.2 | 10.518 |
| | 657.4 | 1 | 8 | 5259.2 | 5259.2 | 10.518 |
| | 657.4 | 2 | 16 | 5259.2 | 5259.2 | 10.518 |
| OC-192/SDH-64 | 155.52 | 1 | 32 | 4976.64 | 4976.64 | 9.953 |
| | 311.04 | 1 | 16 | 4976.64 | 4976.64 | 9.953 |
| | 622.08 | 1 | 8 | 4976.64 | 4976.64 | 9.953 |
| | 622.08 | 2 | 16 | 4976.64 | 4976.64 | 9.953 |
| ITU G.709 | 167.3281 | 1 | 32 | 5354.4992 | 5354.4992 | 10.708 |
| | 334.6562 | 1 | 16 | 5354.4992 | 5354.4992 | 10.708 |
| | 669.3124 | 1 | 8 | 5354.4992 | 5354.4992 | 10.708 |
| | 669.3124 | 2 | 16 | 5354.4992 | 5354.4992 | 10.708 |

In Table 2, the first column, which has the heading "Application", lists the transmission standards, whereas the seventh column, which has the heading "Data Rate (Gbps)" lists the data rates (in Gbps) associated with the transmission standards. The second column, which has the heading "Ref Clock Freq (MHz)", indicates the frequency in megahertz (MHz) of the reference clock signal, e.g., REFCLK0 or PLDCLK. The third column, which has the heading "Ref Div", indicates the factor by which the reference clock signal is divided in selection circuit 120. The fourth column, which has the heading "M", indicates the divide factor for the divider of the PLL selected in transmitter 100. The fifth column, which has the heading "VCO Freq (MHz)", indicates the frequency in MHz of the VCO output signal for the selected PLL in transmitter 100. The sixth column, which has the heading "PLL Freq (MHz)", indicates the frequency in MHz of the PLL output signal for the selected PLL in transmitter 100. As the output of the PLL in transmitter 100 is half-rate, the frequency of the PLL clock signal is half that of the data rate.

Figure 3:
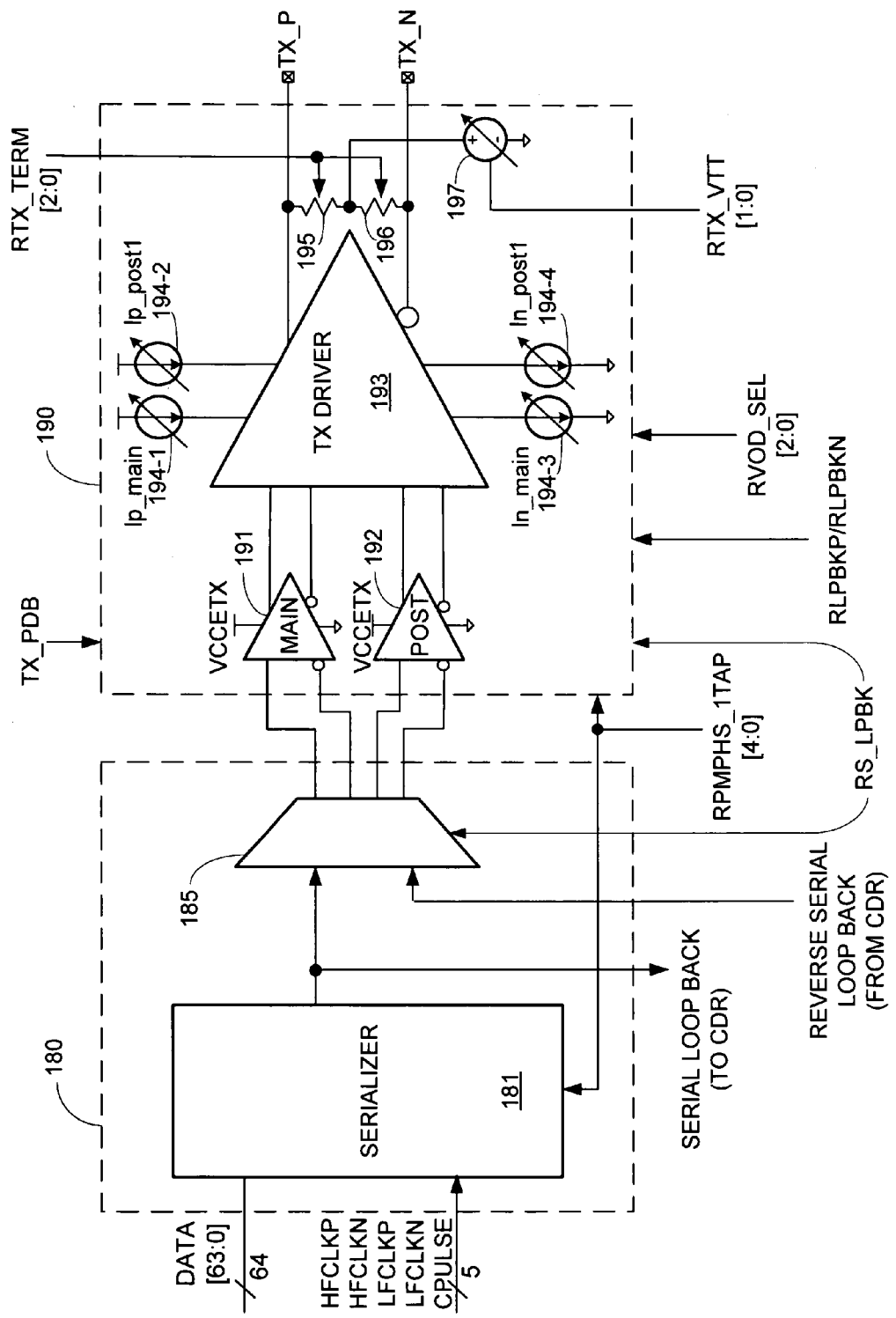
FIG. 3 is a detailed diagram of one embodiment of the transmit path of the transmitter of FIG. 1.

FIG. 3 is a detailed diagram of one embodiment of the transmit path of the transmitter of FIG. 1. As shown in FIG. 3, transmit path 170 includes serializer block 180 and transmit driver block 190.

Serializer block 180 includes serializer 181 and multiplexer 185. Serializer 181 receives the 64 bit wide parallel data stream DATA [63:0], clock signals HFCLKP, HFCLKN, LFCLKP, LFCLKN, and CPULSE, and the signal RPMPHS_1TAP[4:0]. The signal RPMPHS_1TAP[4:0] is a control signal that, among other things, determines whether to use pre-emphasis in serializer 181. In other words, it is a signal that enables pre-emphasis in serializer 181. Serializer 181 outputs a serial data stream, which is sent to the clock data recovery (CDR) block (not shown) and to multiplexer 185. The serial data stream output by serializer 181 is a differential signal. In fact, it is two sets of differential signals, one set to be used in a main-tap pre-driver and another to be used in a post-tap pre-driver.

The serial data stream is sent to the CDR block without going through the receiver (not shown). Using this serial data stream, the CDR block checks its functionality without requiring another chip to drive the receiver. The data path from serializer 181 to the CDR block is part of the serial loop back.

In one embodiment, in addition to receiving the serial data stream from serializer 181, multiplexer 185 receives a serial data stream back from the CDR and a control signal RS_LPBK. The serial data stream received back from the CDR, like that output by serializer 181, includes two sets of differential signals. The data path from the CDR block to multiplexer 185 is part of the reverse serial loop back. The serial data stream received back from the CDR block may be used to test the CDR block output in a serial data stream versus going through the parallel data path. More specifically, the serial data stream received back from the CDR block is compared against the serial data sent to the CDR block via the receiver. The control signal RS_LPBK determines whether multiplexer 185 selects the input from serializer 181 or from the CDR block. In one embodiment, control signal RS_LPBK is programmable at runtime. Multiplexer 185 outputs its selected signals to transmit driver block 190. The output of multiplexer 185, like each of its inputs, includes two sets of differential signals. Multiplexer 185 provides its output of two sets of differential signals to transmit driver block 190. The serial data stream selected by multiplexer 185 drives the transmit driver block 190.

It is to be noted that the serial loop back to the CDR block and the reverse serial loop back from the CDR block are both optional paths. In other words, in another embodiment, one or both of these paths may be absent from transmitter 100. It is also to be noted that, in one embodiment, these loopbacks are enabled by control signals (e.g., RS_LPBK) that are programmable at runtime. In one embodiment, the serial loop back to the CDR block is a first test path and the reverse serial loop back from the CDR block is a second test path. The serial data sent to the CDR block on the first test path is received by the CDR block while bypassing the receiver. This serial data sent to the CDR block is used to generate parallel data, which is sent to the device core where it is compared against parallel data sent by the device core. Thus, the first test path allows testing these two sets of parallel data against each other. Similarly, the second test path allows testing the serial data received from the CDR block against the serial data sent to the CDR block via the receiver. In one embodiment, this testing is done by the test equipment (not shown) receiving the serial data. In another embodiment, the testing can be done by another chip in the system that also "knows" what data should be received back from the CDR block.

Transmit driver block 190 includes main-tap pre-driver 191, post-tap pre-driver 192, transmit driver 193, current sources 194-1, 194-2, 194-3, and 194-4, programmable resisters 195 and 196, and common mode driver 197, which are connected as shown in FIG. 3.

Main-tap pre-driver 191 receives one set of differential signals from multiplexer 185. Similarly, post-tap pre-driver 192 receives another set of differential signals from multiplexer 185. Post-tap pre-driver 192 allows for equalization of lightly attenuated backplanes. In one embodiment, the pre-emphasis boost level is programmable at runtime. Like serializer block 180, transmit driver block 190 also receives the control signals RS_LPBK and RPMPHS_1TAP[4:0]. In transmit driver block 190, signal RPMPHS_1TAP[4:0] is a control signal that determines whether to use pre-emphasis in post-tap pre-driver 192. In other words, it is a signal that enables pre-emphasis in post-tap pre-driver 192. Additionally, the control signal RPMPHS_1TAP[4:0] determines the level of pre-emphasis boost level. The control signal RS_LPBK indicates whether there is a reverse serial loop back signal from the CDR. Main-tap pre-driver 191 and post-tap pre-driver 192 are connected to transmit driver 193 and provide their outputs thereto.

Current sources 194-1, 194-2, 194-3, and 194-4 are programmable current sources connected to transmit driver 193. In one embodiment, current sources 194-1 and 194-2 are p-channel metal oxide semiconductor (PMOS) current sources. Current sources 194-1 and 194-2 may also herein be referred to as Ip_main and Ip_post1, respectively. In one embodiment, current sources 194-3 and 194-4 are n-channel metal oxide semiconductor (NMOS) current sources. Current sources 194-3 and 194-4 may also herein be referred to as In_main and In_post1, respectively. In one embodiment, current sources 194-1, 194-2, 194-3, and 194-4 are programmable at runtime. The control signal RPMPHS_1TAP[4:0], in addition to controlling the signals above, also controls the current sources 194-2 and 194-4 (i.e., Ip_post1 and In_post1). The control signals RVOD_SEL[2:0] control current sources 194-1 and 194-3 (i.e., Ip_main and In_main).

The output terminals of transmit driver 193 are connected to programmable resistors 195 and 196 and output terminal TXP and TXN of transmit driver block 190. The output of transmit driver 193, among other things, depends on the input signals it receives from main-tap pre-driver 191 and post-tap pre-driver 192 and current sources 194-1, 194-2, 194-3, and 194-4. Similarly, common mode driver 197 is also connected to programmable resistors 195 and 196. In one embodiment, common mode driver is programmable at runtime and sets the output common mode. Additionally, output terminals TXP and TXN of transmit driver block 190 are also connected to programmable resistors 195 and 196. The control signal RTX_TERM[2:0] controls the resistance of programmable resistors 195 and 196. Similarly, RTX_VTT[1:0] controls the output of common mode driver 197. The control signal TX_PDB is a power down signal that powers down transmit driver block 190. In one embodiment, the control signal TX_PDB is programmable at runtime. The output of transmit driver block 190 on output terminals TXP and TXN is a differential signal Vod. The differential signal Vod represents the voltage difference between output terminals TXP and TXN and may herein be referred to as the output amplitude or the output swing.

In one embodiment, transmit driver block 190 includes only one post-tap pre-driver to provide pre-emphasis. This is sufficient to allow equalization of lightly attenuated backplanes. In one embodiment, the only one post-tap pre-driver provides equalization in short reach applications (e.g., chip to chip), where attenuation is minimal. In one embodiment, the post-tap pre-driver is a finite impulse response (FIR) filter that emphasizes high frequency content more than low frequency content.

In one embodiment, the output swing (Vod) and the amount of pre-emphasis boost levels are programmable at runtime. In one embodiment, the termination value (i.e., the resistance of programmable resistors 195 and 196) is programmable at runtime. The programmability of the termination values allows centering of the termination value (around a predetermined value, e.g., 50 ohms) to account for process, voltage and temperature (PVT) variation.

In one embodiment, control signal RVOD_SEL[2:0] and control signal RPMPHS_1TAP[4:0] will also allow supporting a tristate mode for transmit driver 193. If all RVOD_SEL [2:0] settings are set to 0 and all the RPMPHS_1TAP[4:0] settings controlling current sources 194-2 and 194-4 (i.e., Ip_post1 and In_post1) are set to 0, then the output of transmit driver 193 would be tristated.

In one embodiment, the transmitter data rates are independent of the receiver data rates. Also, in one embodiment, the transmitter data rates can be different from the receiver data rates.

Also, in one embodiment, transmitter 100 is a high performance, low power transmitter. In one embodiment, transmitter 100 uses an H-bridge or H-tree structure which uses a low voltage differential signaling (LVDS) structure and helps improve the performance and reduce the power consumption of transmitter 100.

In one embodiment, factors (e.g., control signals and variables) that are programmable at runtime may also be programmable during configuration mode. In one embodiment, factors that are programmable at runtime may also be programmable during configuration mode. Factors that are programmable at runtime may be PLD input signals or signals that are generated by logic in the PLD. Factors that are programmable during configuration mode may be stored in the configuration random access memory (CRAM) of the PLD.

FIG. 4 illustrates an exemplary data processing system including an exemplary PLD in which transmitters in accordance with the present invention might be implemented.

Circuits including a transmitter embodying the present invention might be included in a variety of integrated circuits (ICs), including ICs that are PLDs. PLDs (also sometimes referred to as complex PLDs (CPLDs), programmable array logic (PALs), programmable logic arrays (PLAs), field PLAs (FPLAs), erasable PLDs (EPLDs), electrically erasable PLDs (EEPLDs), logic cell arrays (LCAs), field programmable gate arrays (FPGAs), or by other names) provide the advantages of fixed ICs with the flexibility of custom ICs. Such devices typically provide an "off the shelf" device having at least a portion that can be programmed to meet a user's specific needs. Application specific integrated circuits (ASICs) have traditionally been fixed ICs. However, it is possible to provide an ASIC that has a portion or portions that are programmable. Thus, it is possible for an IC device to have qualities of both an ASIC and a PLD. The term PLD as used herein will be considered broad enough to include such devices.

PLDs have configuration elements that may be programmed or reprogrammed. Configuration elements may be realized as random access memory (RAM) bits, flip-flops, electronically erasable programmable read-only memory (EEPROM) cells, or other memory elements. Placing new data into the configuration elements programs or reprograms the PLD's logic functions and associated routing pathways. Configuration elements that are field programmable are often implemented as RAM cells (sometimes referred to a "configuration RAM" (CRAM)). However, many types of configurable elements may be used including static or dynamic RAM (SRAM or DRAM), electrically erasable read-only memory (EEROM), flash, fuse, and anti-fuse programmable connections. The programming of configuration elements could also be implemented through mask programming during fabrication of the device. While mask programming may have disadvantages relative to some of the field programmable options already listed, it may be useful in certain high volume applications. For purposes herein, the generic term "configuration element" will be used to refer to any programmable element that may be configured to determine functions implemented by other PLD elements.

FIG. 4 illustrates, by way of example, PLD 410 in data processing system 400. As one example, a transmitter of this invention (e.g., transmitter 100) may be implemented in PLDs, such as PLD 410. In one embodiment, transmitter 100 is on the same die/chip as PLD 410. In one embodiment, the logic and protocols for transmitter 100 are supported by the programmable PLD core of PLD 410. Data processing system 400 may include one or more of the following components: processor 440, memory 450, input/output (I/O) circuitry 420, and peripheral devices 430. These components are coupled together by system bus 465 and are populated on circuit board 460 which is contained in end-user system 470. A data processing system such as system 400 may include a single end-user system such as end-user system 470 or may include a plurality of systems working together as a data processing system.

System 400 can be used in a wide variety of applications, such as computer networking, data networking, instrumentation, video processing, DSP, or any other application where the advantage of using programmable or reprogrammable logic is desirable. PLD 410 can be used to perform a variety of different logic functions. For example, PLD 410 can be configured as a processor or controller that works in cooperation with processor 440 (or, in alternative embodiments, a PLD might itself act as the sole system processor). PLD 410 may also be used as an arbiter for arbitrating access to a shared resource in system 400. In yet another example, PLD 410 can be configured as an interface between processor 440 and one of the other components in system 400. It should be noted that system 400 is only exemplary.

In one embodiment, system 400 is a digital system. As used herein a digital system is not intended to be limited to a purely digital system, but also encompasses hybrid systems that include both digital and analog subsystems.

Although the transmitter of the present invention may be used in a wide variety of devices, it is particularly useful in a PLD and in situations where standards are evolving. The flexibility of the PLD along with that of the transmitter of the present invention allows the customer to test their design as well as go into production.

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. A transmitter comprising:
   a first phase locked loop (PLL);
   a second PLL coupled to the first PLL; and
   a PLL selection multiplexer coupled to the first and second PLLs, wherein the PLL selection multiplexer receives an output of the first PLL and an output of the second PLL and outputs either the output of the first PLL or the output of the second PLL,
   wherein the first PLL is an inductance-capacitance (LC) type PLL and the second PLL is a ring type PLL and a control signal for controlling selection by the PLL selection multiplexer is programmable at runtime.

2. The transmitter of claim 1, wherein:
   the first PLL comprises:
      a first phase-frequency detector (PFD);
      a first charge pump (CP) coupled to the first PFD;
      a first loop filter (LF) coupled to the first CP;
      an LC type voltage controlled oscillator (VCO) coupled to first LF; and
      a first divider coupled to the LC type VCO and the first PFD, wherein the first divider is programmable at runtime; and
   the second PLL comprises:
      a second PFD;
      a second CP coupled to the second PFD;
      a second LF coupled to the second CP;
      a ring type VCO coupled to second LF; and
      a second divider coupled to the ring type VCO and the second PFD, wherein the second divider is programmable at runtime.

3. The transmitter of claim 2 further comprising:
   a clock management unit (CMU) including:
      the first PLL;
      the second PLL;
      the PLL selection multiplexer; and
      a clock generation block coupled to the P selection multiplexer;
   a serializer block coupled to the CMU; and
   a transmit driver block coupled to the serializer block.

4. The transmitter of claim 3, wherein the CMU further comprises:
   a first selection circuit including:
      a first input path;
      a second input path;
      a third input path; and
      a first multiplexer coupled to the first, second, and third input paths and selecting between inputs received on the first, second, and third input paths; and
   a second multiplexer coupled to the first selection circuit and a first reference clock signal, wherein the second multiplexer selects between the first reference clock signal and an output of the first multiplexer.

5. The transmitter of claim 4, wherein the second input path includes a divide-by-two divider, the third input path includes a divide-by-four divider, wherein the divide-by-two divider and the divide-by-four divider are both programmable at runtime.

6. The transmitter of claim 4 further comprising:
   a clock input buffer coupled to the CMU, wherein the clock input buffer provides a first reference clock signal to the first selection circuit.

7. The transmitter of claim 3, wherein the serializer block comprises:
   a serializer; and
   a serializer multiplexer coupled to the serializer, wherein the serializer multiplexer selects between an output of the serializer and serial data received from a clock data recovery (CDR) block.

8. The transmitter of claim 3, wherein the transmit driver block comprises:
   a transmit driver;
   only one main-tap pre-driver coupled to the transmit driver; and
   only one post-tap pre-driver coupled to the transmit driver.

9. A programmable logic device including the transmitter of claim 1.

10. A digital system comprising a programmable logic device including the transmitter of claim 1.

11. A method of transmitting a signal, the method comprising:
    providing an output of a first phase locked loop (PLL);
    providing an output of a second PLL coupled to the first PLL; and
    selecting between an output of the first PLL and an output of the second PLL,
    wherein the first PLL is an inductance-capacitance (LC) type PLL and the second PLL is a ring type PLL and the selecting is programmable at runtime.

12. The method of claim 11 further comprising:
    selecting between a first reference signal and a second reference signal to provide to the first PLL and the second PLL.

13. The method of claim 12 further comprising:
    sending a reference signal to a multiplexer;
    sending a first divided reference signal to the multiplexer;
    sending a second divided reference signal to the multiplexer; and
    selecting between the reference signal, the first divided reference signal, and the second divided reference signal, wherein a selected signal is the first reference signal.

14. A transmitter comprising:
    a clock management unit (CMU) comprising:
       an inductance-capacitance (LC) type phase locked loop (PLL), wherein the LC type PLL includes a first phase-frequency detector (PFD), a first charge pump (CP) coupled to the first PFD, a first loop filter (LF) coupled to the first CP, an LC type voltage controlled oscillator (VCO) coupled to first LF, and a first divider coupled to the LC type VCO and the first PFD;
       a ring type PLL coupled to the LC type PLL, wherein the ring type PLL includes a second PFD, a second CP coupled to the second PFD, a second LF coupled to the second CP, a ring type VCO coupled to second LF, and a second divider coupled to the ring type VCO and the second PFD;
       a PLL selection multiplexer coupled to the LC type PLL and the ring type PLL, wherein the PLL selection multiplexer receives an output of the LC type PLL and an output of the ring type PLL and outputs either the output of the LC type PLL or the output of the ring type PLL; and
       a clock generation block coupled to the PLL multiplexer;
    a serializer block coupled to the CMU; and
    a transmit driver block coupled to the serializer block.

15. The transmitter of claim 14, wherein the CMU further comprises:
a first selection circuit including:
a first input path;
a second input path;
a third input path; and
a first multiplexer coupled to the first, second, and third input paths and selecting between inputs received on the first, second, and third input paths; and
a second multiplexer coupled to the first selection circuit and a first reference clock signal, wherein the second multiplexer selects between the first reference clock signal and an output of the first multiplexer.

16. The transmitter of claim 15, wherein the serializer block comprises:
a serializer; and
a serializer multiplexer coupled to the serializer, wherein the serializer multiplexer selects between an output of the serializer and serial data received from a clock data recovery (CDR) block.

17. The transmitter of claim 16, wherein the transmit driver block comprises:
a transmit driver;
only one main-tap pre-driver coupled to the transmit driver; and
only one post-tap pre-driver coupled to the transmit driver.

18. A programmable logic device including the transmitter of claim 14.

19. A digital system comprising a programmable logic device including the transmitter of claim 14.

20. A transmitter comprising:
a first selection circuit including:
a first input path;
a second input path;
a third input path; and
a first multiplexer coupled to the first, second, and third input paths and selecting between inputs received on the first, second, and third input paths;
a second multiplexer coupled to the first selection circuit and a first reference clock signal, wherein the second multiplexer selects between the first reference clock signal and an output of the first multiplexer;
a first phase locked loop (PLL) coupled to the second multiplexer, wherein the first PLL receives an output of the second multiplexer;
a second PLL coupled to the first PLL and the second multiplexer, wherein the second PLL receives the output of the second multiplexer; and
a PLL selection multiplexer coupled to the first and second PLLs, wherein the PLL selection multiplexer receives an output of the first PLL and an output of the second PLL and outputs either the output of the first PLL or the output of the second PLL.

21. A method of transmitting a signal, the method comprising:
sending a reference signal to a multiplexer;
sending a first divided reference signal to the multiplexer;
sending a second divided reference signal to the multiplexer; and
selecting between the reference signal, the first divided reference signal, and second divided reference signal, wherein a selected signal is a first reference signal;
providing an output of a first phase locked loop (PLL), wherein the first PLL receives the first reference signal or a second reference signal;
providing an output of a second PLL coupled to the first PLL, wherein the second PLL receives the first reference signal or the second reference signal; and
selecting between an output of the first PLL and an output of the second PLL.

* * * * *